(12) United States Patent
Chen

(10) Patent No.: US 8,415,785 B1
(45) Date of Patent: Apr. 9, 2013

(54) METAL RING TECHNIQUES AND CONFIGURATIONS

(75) Inventor: Chender Chen, Fongyuan (TW)

(73) Assignee: Marvell International Ltd., Hamilton (BE)

( * ) Notice: Subject to any disclaimer, the term of this patent is extended or adjusted under 35 U.S.C. 154(b) by 111 days.

(21) Appl. No.: 12/986,529

(22) Filed: Jan. 7, 2011

Related U.S. Application Data

(60) Provisional application No. 61/298,829, filed on Jan. 27, 2010.

(51) Int. Cl.
*H01L 23/48* (2006.01)

(52) U.S. Cl. ........ 257/690; 257/691; 257/698; 257/773; 257/E23.011; 438/106; 438/121

(58) Field of Classification Search .......... 257/678–734, 257/750, 762, 780, 781, 782, 784, 773, E23.001–E23.194; 438/107, 125, 106, 121, FOR. 409
See application file for complete search history.

(56) References Cited

U.S. PATENT DOCUMENTS

| | | | |
|---|---|---|---|
| 5,808,873 A * | 9/1998 | Celaya et al. | 361/760 |
| 5,841,191 A * | 11/1998 | Chia et al. | 257/691 |
| 6,424,047 B1 * | 7/2002 | Chua et al. | 257/773 |
| 6,617,680 B2 * | 9/2003 | Chien-Chih et al. | 257/698 |
| 6,790,760 B1 * | 9/2004 | Cohn et al. | 438/613 |
| 6,897,555 B1 * | 5/2005 | Lim et al. | 257/692 |
| 2007/0018308 A1 * | 1/2007 | Schott et al. | 257/700 |
| 2008/0174005 A1 * | 7/2008 | Kubota et al. | 257/700 |

* cited by examiner

*Primary Examiner* — Jasmine Clark

(57) ABSTRACT

Embodiments of the present disclosure provide an apparatus comprising a substrate layer, a metal ring structure disposed on the substrate layer, the metal ring structure having an opening defined therein, and a solder mask layer coupled to (i) the metal ring structure and (ii) the substrate layer through the opening defined in the metal ring structure, the solder mask layer having a solder mask opening defined therein, wherein an edge of solder mask material defining the solder mask opening overlaps a portion of the opening defined in the metal ring structure. Other embodiments may be described and/or claimed.

20 Claims, 4 Drawing Sheets

METAL RING TECHNIQUES AND CONFIGURATIONS

CROSS REFERENCE TO RELATED APPLICATIONS

This disclosure claims priority to U.S. Provisional Patent Application No. 61/298,829, filed Jan. 27, 2010, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to techniques and configurations of metal ring structures used in substrates for package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, one of the challenges of integrated circuit (IC) manufacturing is delamination that occurs between materials having a different coefficient of thermal expansion (CTE). For example, a CTE mismatch between a solder mask material and a metal material of a substrate can cause stresses between the materials during heating/cooling that results in structural defects such as delamination.

SUMMARY

In one embodiment, the present disclosure provides an apparatus comprising a substrate layer, a metal ring structure disposed on the substrate layer, the metal ring structure having an opening defined therein, and a solder mask layer coupled to (i) the metal ring structure and (ii) the substrate layer through the opening defined in the metal ring structure, the solder mask layer having a solder mask opening defined therein, wherein an edge of solder mask material defining the solder mask opening overlaps a portion of the opening defined in the metal ring structure.

In another embodiment, the present disclosure provides a method comprising forming a metal ring structure on a substrate layer, the metal ring structure having one or more openings in the metal ring structure to expose the substrate layer through the one or more openings, forming a metal film on at least a portion of the metal ring structure, and forming a solder mask layer that is coupled to (i) the metal ring structure and (ii) the substrate layer through the one or more openings in the metal ring structure, the solder mask layer having a solder mask opening, wherein an edge of solder mask material defining the solder mask opening overlaps a portion of the one or more openings in the metal ring structure.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques and configurations for reducing delamination associated with a metal ring structure in an integrated circuit (IC) package assembly (referred to as "package assembly" herein). The description may use perspective-based descriptions such as up/down, over/under, and/or top/bottom. Such descriptions are merely used to facilitate the discussion and are not intended to restrict the application of embodiments described herein to any particular orientation.

Figure 1A:
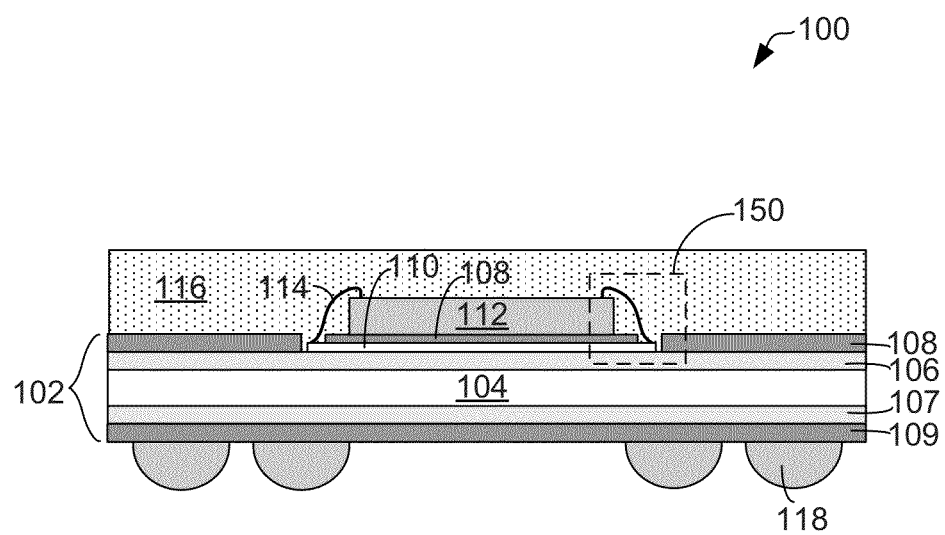
FIG. 1A schematically illustrates a cross-section view of a package assembly.

FIG. 1A schematically illustrates a cross-section view of a package assembly 100. The package assembly 100 includes a substrate 102 having a core 104, laminate layers 106, 107 and solder mask layers 108, 109, coupled as shown. Material for the core 104 can include, for example, a resin. In some embodiments, the core 104 includes a stage B/C thermosetting resin. The laminate layers 106, 107 can include a laminate material such as, for example, epoxy/resin based materials. In some embodiments, the laminate material includes Flame Retardant 4 (FR4) or Bismaleimide-Triazine (BT). The solder mask layers 108, 109 generally comprise a solder resist material such as, for example, an epoxy. The materials are not limited to these examples and other suitable materials for the substrate 102 can be used in other embodiments. In an embodiment, the substrate 102 is a busless multi-layer substrate. Although the depicted substrate 102 generally represents an organic/laminate substrate, other suitable substrate configurations that benefit from the principles described herein can be used in other embodiments.

The substrate 102 generally includes one or more electrically conductive structures to route electrical signals, e.g., input/output (I/O) or power/ground signals, of a die 112. For example, a metal ring structure 110 can be formed to route power/ground signals, e.g., $V_{DD}N_{SS}$, of the die 112. The metal ring structure 110 is referred to as a "ring structure" owing to a ring-like form of the structure when viewed from a top view (e.g., as generally depicted by the metal ring structure 110 in the top view of the package assembly 100 in FIG. 1B). The metal ring structure 110 is electrically continuous to provide a common electrical signal. According to various embodiments, the metal ring structure 110 is a metal layer that is disposed on a substrate layer, such as the laminate layer 106, as shown. Other electrically conductive structures, e.g., traces or via-type structures, can be formed on or through the substrate 102 to route the electrical signals of the die 112 throughout the substrate, but are not shown to avoid obscuring aspects of the present disclosure.

The solder mask layer 108 is generally disposed on the metal ring structure 110 and the laminate layer 106, as shown. A solder mask opening (e.g., solder mask opening 222 of FIG.

2A), also referred to as a solder resist opening (SRO), is defined/formed in the solder mask layer 108 to expose the underlying metal ring structure 110. In some embodiments, the solder mask opening is formed in the solder mask layer 108 in a region over a terminating edge of the metal ring structure 110, as shown.

The die 112 is attached to the solder mask layer 108 in a region over the metal ring structure 110 as shown. The die 112 can be attached using an adhesive (not shown) or any other suitable die attach technique. The die 112 is electrically coupled to the metal ring structure 110 through the solder mask opening in the solder mask layer 108 using one or more bonding wires 114, as shown. Region 150 depicts an area of the package assembly 100 where the die 112 is electrically coupled to the metal ring structure 110 and is described in greater detail in connection with FIG. 2A.

A mold compound 116 encapsulates the die 112 and the one or more bonding wires 114. In some embodiments, the mold compound 116 substantially covers a surface of the substrate 102, as shown.

One or more package interconnect structures, such as solder balls 118, can be coupled to the substrate 102 to further route the electrical signals of the die 112. According to some embodiments, the package assembly 100 is a ball-grid array (BGA) package assembly. Other types of package assemblies—e.g., quad-in-line packages, dual-in-line packages, small outline packages, and so on—that benefit from the principles described herein can be used in other embodiments.

Figure 1B:
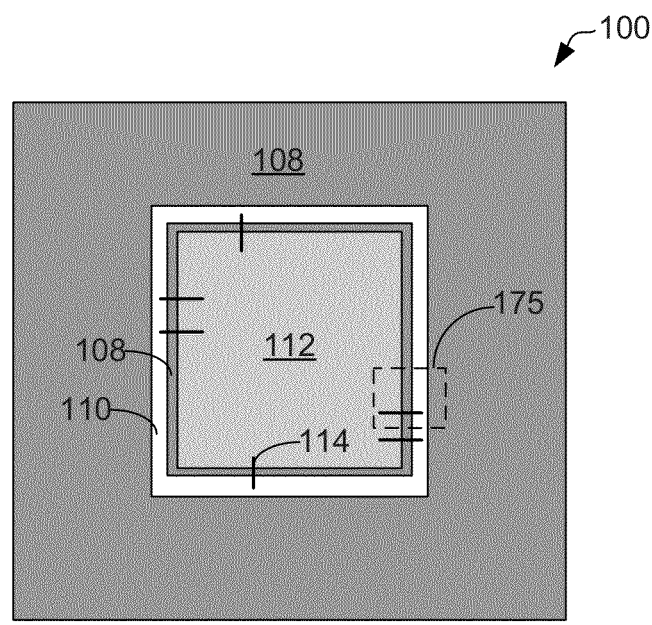
FIG. 1B schematically illustrates a top view of the package assembly.

FIG. 1B schematically illustrates a top view of the package assembly 100 of FIG. 1A. In the top view of FIG. 1B, the mold compound (e.g., mold compound 116 of FIG. 1A) is omitted for the sake of clarity. As shown, the solder mask opening in the solder mask layer 108 exposes the metal ring structure 110. According to various embodiments, the metal ring structure 110 substantially surrounds the die 112 and provides a bonding area for forming electrical connections with the die 112. The one or more bonding wires 114 are bonded to a surface of the die 112 and to the metal ring structure 110. Region 175 depicts an area of the package assembly 100 where the die 112 is electrically coupled to the metal ring structure 110 and is described in greater detail in connection with FIG. 2B.

Figure 2A:
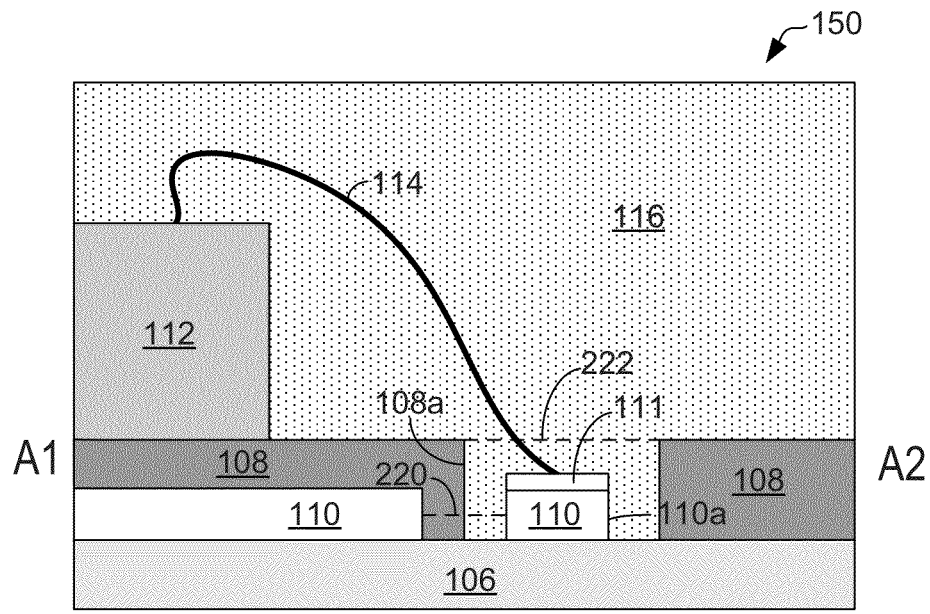
FIG. 2A schematically illustrates an enlarged cross-section view of a region of the package assembly.

FIG. 2A schematically illustrates an enlarged cross-section view of region 150 of the package assembly 100 depicted in FIG. 1A. In an embodiment, FIG. 2A represents a cross-section view through segment A1-A2 of FIG. 2B. The metal ring structure 110 is disposed on the laminate layer 106 and has one or more openings 220 defined/formed in the metal ring structure 110. The one or more openings 220 are configured to reduce delamination defects between the solder mask layer 108 and the metal ring structure 110. For example, the one or more openings 220 allow material of the solder mask layer 108 and the mold compound 116 to adhere to the laminate layer 106 through the one or more openings 220 and mitigate stresses associated with heating/cooling of materials with different/mismatched coefficients of thermal expansion (CTE). The one or more openings 220 provide additional room for expansion/contraction of the metal ring structure 110 to mitigate stresses that cause delamination defects.

The solder mask layer 108 is coupled to the metal ring structure 110 and the laminate layer 106, as shown. That is, the solder mask layer 108 is coupled to the laminate layer 106 through the one or more openings 220 formed in the metal ring structure 110 and coupled to the laminate layer 106 in a region external to the one or more openings 220. The solder mask layer 108 includes a solder mask opening 222. An edge 108a of solder mask material that defines the solder mask opening 222 overlaps only a portion of the one or more openings 220 formed in the metal ring structure 110, as shown.

Figure 2B:
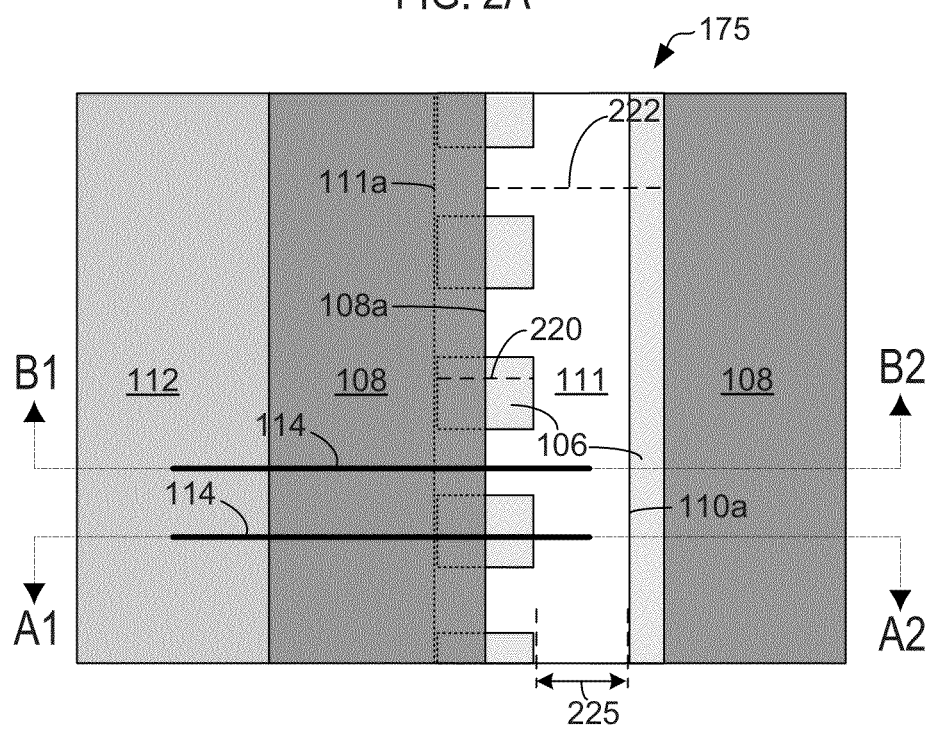
FIG. 2B schematically illustrates an enlarged top-view of a region of the package assembly.

FIG. 2B schematically illustrates an enlarged top-view of region 175 of the package assembly 100 depicted in FIG. 1B. Referring to both FIGS. 2A and 2B, a metal film 111 is disposed on at least a portion of the metal ring structure 110. In some embodiments, the metal film 111 is formed on a peripheral portion of the metal ring structure 110. For example, the metal film 111 can be disposed on the metal ring structure 110 adjacent to a terminating edge 110a of the metal ring structure 110. In this region, the metal film 111 provides a bonding area 225 where the one or more bonding wires 114 are bonded. The one or more bonding wires 114 electrically couple the die 112 to the metal ring structure 110 through the solder mask opening 222, as shown.

In some embodiments, a portion of the metal film 111 is disposed within the solder mask opening 222 and a portion of the metal film 111 is disposed between the solder mask layer 108 and the metal ring structure 110. For example, in the depicted embodiment of FIG. 2B, the metal film 111 has an edge 111a that is dashed to indicate that the metal film 111 is below the depicted solder mask layer 108. As depicted, the edge 111a of the metal film 111 extends towards the die 112 beyond the edge 108a of the solder mask layer 108. In some embodiments, the edge 111a of the metal film 108 can extend toward the die 112 beyond the one or more openings 220.

The metal film 111 can be used to facilitate bonding with the one or more bonding wires 114 in order to establish an electrical connection between the die 112 and the metal ring structure 110. In various embodiments, the metal film 111 comprises a metal that is elementally different from a metal used to form the metal ring structure 110. In some embodiments, the metal ring structure 110 comprises copper and the metal film 111 comprises nickel and/or gold. Other suitable materials for the metal ring structure 110 and the metal film 111 can be used in other embodiments.

According to various embodiments, the metal ring structure 110 is configured to route power or ground signals for the die 112. In an embodiment, the metal ring structure 110 forms a first ring structure to route ground signals for the die 112 and another metal ring structure (not shown) forms a second ring structure to route power signals for the die 112. According to various embodiments, the metal ring structure 110 is electrically continuous to provide a common electrical signal for the die 112.

The die 112 is coupled to the solder mask layer 108. The one or more bonding wires 114 are bonded to a surface of the die 112 and to the metal film 111 through the solder mask opening 222. The one or more bonding wires 114 generally comprise a metal such as, for example, gold, copper, or aluminum. Although not depicted, the die 112 can include bond pads to facilitate the wirebonding.

In some embodiments, mold compound 116 is disposed to encapsulate the die 112 and the bonding wire 114. The mold compound 116 is coupled to the laminate layer 106 through the one or more openings 220 formed in the metal ring structure 110, as shown in FIG. 2A. In some embodiments, the solder mask layer 108 is disposed to fill only a portion of the one or more openings 220 formed in the metal ring structure 110 and the mold compound 116 is disposed to fill the remaining portion of the one or more openings 220.

As shown in FIG. 2B, the one or more openings 220 can include multiple openings aligned in a row along the edge 108a of the solder mask layer 108. Although the one or more openings 220 are depicted as rectangular in shape, other shapes can be used in other embodiments including, for example, circular shapes. The one or more openings 220 of FIG. 2B include a dashed portion to indicate that a portion of the one or more openings 220 is disposed below the solder mask layer 108.

The embodiments described in connection with regions 150 and 175 of respective FIGS. 2A and 2B can be generally applied to other regions of the package assembly 100 of FIGS. 1A and 1B. For example, the one or more openings 220 can be arranged in the metal ring structure on each side of the die 112 to promote adhesion and reduce delamination between the described layers.

Figure 2C:
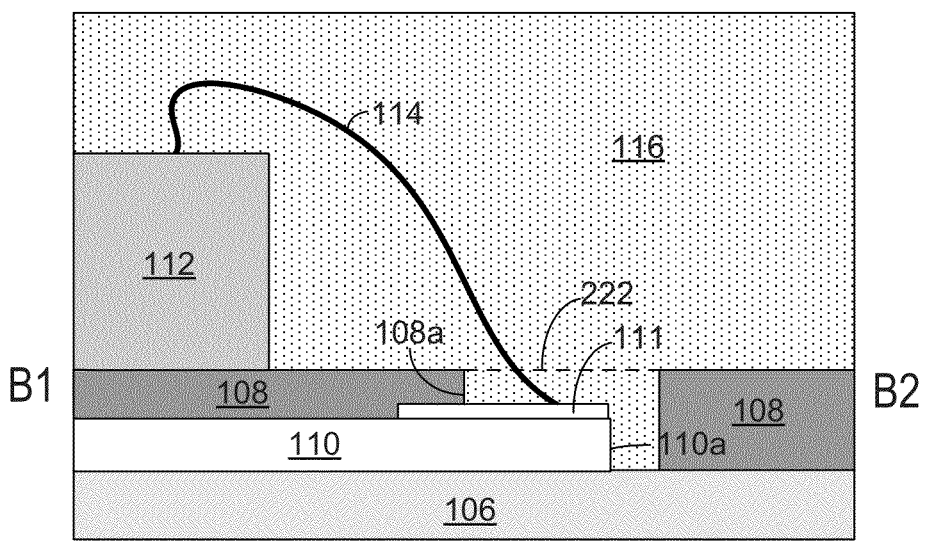
FIG. 2C schematically illustrates another enlarged cross-section view of the package assembly.

FIG. 2C schematically illustrates another enlarged cross-section view of the package assembly 100. In an embodiment, FIG. 2C represents a cross-section view through segment B1-B2 of FIG. 2B. As can be seen, the metal ring structure 110 is continuous in the depicted region. The metal film 111 can extend on the metal ring structure 110 such that the solder mask layer 108 overlaps at least a portion of the metal film 111. One or more bonding wires 114 can be coupled to the metal ring structure 110, e.g., via metal film 111, in the depicted region according to various embodiments.

Figure 3:
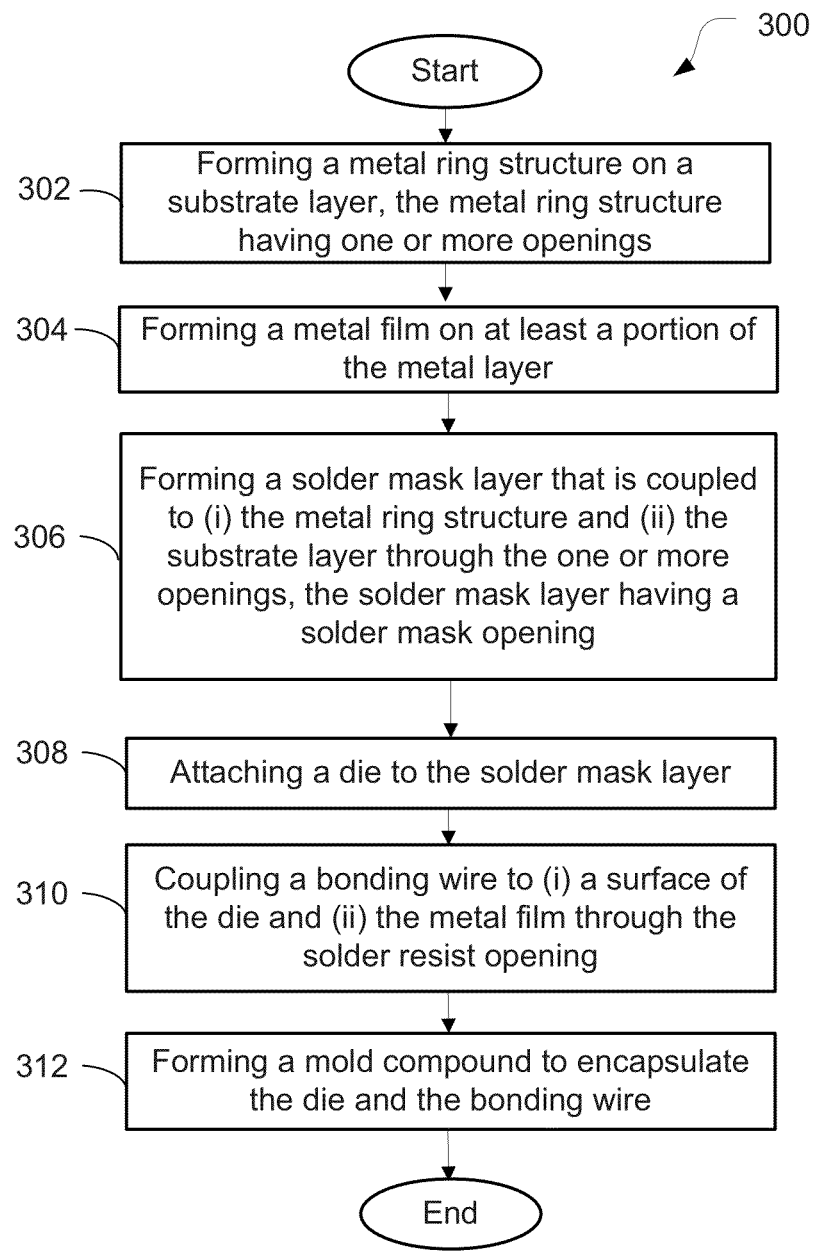
FIG. 3 is a process flow diagram of a method to fabricate the package assembly.

FIG. 3 is a process flow diagram of a method 300 to fabricate the package assembly 100 of FIGS. 1A-1B. The method 300 may comport with embodiments described in connection with FIGS. 1A-1B and 2A-2B.

At 302, the method 300 includes forming a metal ring structure (e.g., the metal ring structure 110 of FIG. 1A) on a substrate layer (e.g., the laminate layer 106 of FIG. 1A), the metal ring structure having one or more openings (e.g., the one or more openings 220 of FIGS. 2A-2B). The metal ring structure is formed to route power or ground signals for a die (e.g., the die 112 of FIGS. 1A-1B, 2A-2B), according to various embodiments.

The metal ring structure can be formed, for example, by depositing a metal layer, such as copper, on the substrate layer. The metal layer can, for example, be blanket deposited on the substrate layer using any suitable technique including, for example, chemical vapor deposition (CVD) or physical vapor deposition (PVD). Other suitable deposition techniques and/or metals can be used in other embodiments.

The one or more openings in the metal ring structure are formed to expose the substrate layer. In some embodiments, the one or more openings are formed in a peripheral portion of the metal ring structure that is adjacent to a terminating edge (e.g., the terminating edge 110*a* of FIGS. 2A-2B) of the metal ring structure. The one or more openings can be formed, for example, by using a patterning process such as a dry film-etch process. In some embodiments, the one or more openings are formed concurrently with a patterning process used to form other electrical features of substrate circuitry, such as traces, on the substrate layer.

At 304, the method 300 further includes forming a metal film (e.g., the metal film 111 of FIGS. 2A-2B) on at least a portion of the metal ring structure. The metal film is generally formed to facilitate wirebonding (e.g., bonding adhesion) between the die and the metal ring structure. The metal film can be formed, for example, by depositing a metal such as nickel and/or gold, on at least a portion of the metal ring structure. The metal film can be deposited using any suitable technique including, for example, a plating process. Other suitable deposition techniques and materials can be used to form the metal film in other embodiments.

In some embodiments, the metal film is formed using a sacrificial metal film, which is used during fabrication but is substantially removed in a final product. For example, a sacrificial metal film comprising copper can be deposited on the metal ring structure and on the substrate layer within the one or more openings formed in the metal ring structure. A portion of the sacrificial metal film can be removed to expose a portion of the metal ring structure. That is, the portion of the sacrificial metal can be removed from an area of the metal ring structure where the metal film is to be formed. In some embodiments, the sacrificial metal is removed from an area of the metal ring structure that corresponds with a solder mask opening (e.g., the solder mask opening 222 of FIGS. 2A-2B) to be formed in a solder mask layer (e.g., the solder mask layer 108 of FIGS. 1A-1B, 2A-2B) on the metal ring structure. The sacrificial metal can be selectively removed from this area, for example, by using a resist film and etch process.

An additional resist film can be deposited over the resist film used to selectively remove the sacrificial metal in order to substantially cover and protect any exposed sacrificial metal from a plating process used to form the metal film on the exposed metal ring structure. The metal film is subsequently deposited on the exposed portion of the metal ring structure. For example, a plating process can be used to form the metal film in areas where the sacrificial metal has been removed to expose the metal ring structure. A resist stripping and/or clean process can be used to remove all resist films. A remaining portion of the sacrificial metal film can then be substantially removed from the metal ring structure and the substrate layer by etching. The etching can be performed, for example, using a selective etch process that etches the sacrificial metal film, but does not etch the metal film formed on the metal ring structure.

At 306, the method 300 further includes forming a solder mask layer (e.g., the solder mask layer 108 of FIGS. 1A-1B, 2A-2B) having a solder mask opening (e.g., the solder mask opening 222 of FIGS. 2A-2B), the solder mask layer being coupled to the metal ring structure and to the substrate layer through the one or more openings in the metal ring structure. In some embodiments, an edge (e.g., the edge 108*a* of FIGS. 2A-2B) of solder mask material defining the solder mask opening overlaps a portion of the one or more openings formed in the metal ring structure. An opposing edge of the solder mask material can be formed to expose the terminating edge (e.g., the terminating edge 110*a* of FIGS. 2A-2B) of the metal ring structure.

According to various embodiments, the solder mask layer is formed such that a portion of the metal film is disposed/exposed within the solder mask opening and a portion of the metal film is disposed between the solder mask layer and the metal ring structure. The solder mask layer can be formed, for example, by using a stencil printing method, a patterning method, or any other suitable technique.

At 308, the method 300 further includes attaching a die (e.g., the die 112 of FIGS. 1A-1B, 2A-2B) to the solder mask layer. The die can include a variety of dies including chips for memory, logic, or other applications. In some embodiments, multiple dies can be electrically coupled to the substrate (e.g., the substrate 102 of FIG. 1). The die can be attached using any suitable technique including, for example, using a die-adhesive to couple an inactive surface of the die to the solder mask layer.

At 310, the method 300 further includes coupling a bonding wire (e.g., the one or more bonding wires 114 of FIGS. 1A-1B, 2A-2B) to a surface of the die and to the metal film through the solder resist opening. The wirebonding can be performed using any suitable technique including, for example, ball-bonding or wedge-bonding processes. In an embodiment, the bonding wire is coupled to the metal film in a bonding area (e.g., the bonding area 225 of FIG. 2B) of the metal film that is adjacent to the terminating edge of the metal ring structure. According to various embodiments, the bonding wire is coupled to the die and to the metal film in order to route power or ground signals for the die.

At 312, the method 300 further includes forming a mold compound (e.g., the mold compound 116 of FIGS. 1A and 2A) to encapsulate the die and the bonding wire. The mold compound can be formed using any suitable molding technique. In some embodiments, the mold compound is coupled to the substrate layer through the one or more openings formed in the metal ring structure. The mold compound can be formed to substantially fill a remaining portion of the one or more openings that is not filled by the solder mask material of the solder mask layer.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
    a substrate layer;
    a metal ring structure disposed on the substrate layer, the metal ring structure having an opening defined therein; and
    a solder mask layer coupled to (i) the metal ring structure and (ii) the substrate layer through the opening defined in the metal ring structure, the solder mask layer having a solder mask opening defined therein, wherein an edge of solder mask material defining the solder mask opening overlaps a portion of the opening defined in the metal ring structure.

2. The apparatus of claim 1, wherein the metal ring structure comprises a first metal, the apparatus further comprising:
    a metal film disposed on at least a portion of the metal ring structure, the metal film comprising a second metal that is elementally different from the first metal.

3. The apparatus of claim 2, wherein:
    the first metal comprises copper; and
    the second metal comprises nickel or gold.

4. The apparatus of claim 2, wherein:
    a first portion of the metal film is disposed within the solder mask opening; and
    a second portion of the metal film is disposed between the solder mask layer and the metal ring structure.

5. The apparatus of claim 2, further comprising:
    a die coupled to the solder mask layer; and
    a bonding wire bonded to (i) a surface of the die and (ii) the metal film through the solder mask opening, wherein the bonding wire is bonded to the metal film in a bonding area of the metal film that is adjacent to a terminating edge of the metal ring structure.

6. The apparatus of claim 5, further comprising:
    a mold compound disposed to encapsulate (i) the die and (ii) the bonding wire, wherein the mold compound is coupled to the substrate layer through the opening defined in the metal ring structure.

7. The apparatus of claim 1, wherein the metal ring structure is configured to route power or ground signals for the die.

8. The apparatus of claim 1, wherein the substrate layer is a laminate layer comprising at least one of a Flame Retardant 4 (FR4) material and a Bismaleimide-Triazine (BT) material.

9. The apparatus of claim 1, wherein the solder mask material of the solder mask layer is disposed to fill about half of the opening defined in the metal ring structure.

10. The apparatus of claim 1, wherein:
    the opening defined in the metal ring structure is one of multiple openings defined in the metal ring structure;
    the solder mask layer is coupled to the substrate layer through the multiple openings defined in the metal ring structure; and
    the edge of the solder mask material defining the solder mask opening overlaps a portion of each of the multiple openings defined in the metal ring structure.

11. A method comprising:
    forming a metal ring structure on a substrate layer, the metal ring structure having one or more openings in the metal ring structure to expose the substrate layer through the one or more openings;
    forming a metal film on at least a portion of the metal ring structure; and
    forming a solder mask layer that is coupled to (i) the metal ring structure and (ii) the substrate layer through the one or more openings in the metal ring structure, the solder mask layer having a solder mask opening, wherein an edge of solder mask material defining the solder mask opening overlaps a portion of the one or more openings in the metal ring structure.

12. The method of claim 11, wherein the solder mask layer is formed such that (i) a first portion of the metal film is disposed within the solder mask opening and (ii) a second portion of the metal film is disposed between the solder mask layer and the metal ring structure.

13. The method of claim 11, further comprising:
    attaching a die to the solder mask layer.

14. The method of claim 13, further comprising:
    coupling a bonding wire to (i) a surface of the die and (ii) the metal film through the solder mask opening.

15. The method of claim 14, wherein the bonding wire is coupled to the metal film in a bonding area of the metal film that is adjacent to a terminating edge of the metal ring structure.

16. The method of claim 14, further comprising:
forming a mold compound to encapsulate (i) the die and (ii) the bonding wire, wherein the mold compound is coupled to the substrate layer through the one or more openings.

17. The method of claim 11, wherein:
the metal ring structure is formed by depositing copper;
the metal film is formed by depositing nickel or gold;
the substrate layer is a laminate layer comprising at least one of a Flame Retardant 4 (FR4) material and a Bismaleimide-Triazine (BT) material.

18. The method of claim 11, wherein the metal film is formed by:
depositing a sacrificial metal film (i) on the metal ring structure and (ii) on the substrate layer within the one or more openings in the metal ring structure;
removing a portion of the sacrificial metal film to expose a portion of the metal ring structure;
depositing the metal film on the exposed portion of the metal ring structure; and
removing a remaining portion of the sacrificial metal film from the metal ring structure and the substrate layer.

19. The method of claim 11, wherein the solder mask layer is formed by a stencil printing method.

20. The method of claim 11, wherein the metal ring structure is formed to route power or ground signals for the die.

* * * * *